(12) United States Patent
Marten et al.

(10) Patent No.: US 7,944,710 B2
(45) Date of Patent: May 17, 2011

(54) TERMINATION APPARATUS AND METHOD FOR PLANAR COMPONENTS ON PRINTED CIRCUIT BOARDS

(75) Inventors: Victor Marten, Flushing, NY (US); Aakar Patel, Fremont, CA (US); Mark Vanstone, Camarillo, CA (US)

(73) Assignee: Battery-Biz Inc., Camarillo, CA (US)

( * ) Notice: Subject to any disclaimer, the term of this patent is extended or adjusted under 35 U.S.C. 154(b) by 149 days.

(21) Appl. No.: 12/528,443

(22) PCT Filed: Oct. 6, 2008

(86) PCT No.: PCT/US2008/078959
§ 371 (c)(1),
(2), (4) Date: Aug. 28, 2009

(87) PCT Pub. No.: WO2009/046428
PCT Pub. Date: Apr. 9, 2009

(65) Prior Publication Data
US 2010/0118505 A1 May 13, 2010

Related U.S. Application Data

(60) Provisional application No. 60/997,633, filed on Oct. 5, 2007.

(51) Int. Cl.
*H05K 1/11* (2006.01)
(52) U.S. Cl. ........ 361/803; 361/736; 361/760; 361/773; 361/790; 361/807; 174/260; 174/261; 174/262; 174/263; 174/265; 29/845; 29/852; 439/876
(58) Field of Classification Search .................. 361/803, 361/736, 760, 773, 774, 777, 790, 807; 174/260–263, 265; 29/842, 845, 852; 439/83, 439/260, 876
See application file for complete search history.

(56) References Cited

U.S. PATENT DOCUMENTS
5,389,885 A 2/1995 Swart
(Continued)

FOREIGN PATENT DOCUMENTS
KR 1994-0004702 U 2/1994
(Continued)

OTHER PUBLICATIONS
International search report for international application No. PCT/US2008/078959.
(Continued)

*Primary Examiner* — Xiaoliang Chen
(74) *Attorney, Agent, or Firm* — Oppedahl Patent Law Firm LLC

(57) ABSTRACT

The disclosure involves the efficient termination of a winding PCB of a planar inductive component to a main PCB, using relatively little space and providing a low-resistance connection. The disclosed methods are especially suitable for planar structures where several winding PCBs, and/or winding PCBs and a main PCB, are all enclosed by the magnetic path components. The methods allow for a winding PCB to simply rest on the main PCB, or other winding PCBs, without any clearance. The disclosure employs mating sets of conductive annular rings with an optional interlocking terminal pin that allows two PCBs to be fixedly coupled together, while preserving a minimum distance between the solder-mask layers of the two PCBs in order to prevent the formation of unwanted electrical connections between the two PCBs. Solder is used to ensure effective coupling in each assembly of mating annular rings and optional terminal pin.

24 Claims, 3 Drawing Sheets

U.S. PATENT DOCUMENTS

| | | | |
|---|---|---|---|
| 5,548,486 A * | 8/1996 | Kman et al. | 361/791 |
| 6,036,508 A * | 3/2000 | Anderson et al. | 439/80 |
| 6,700,079 B2 * | 3/2004 | Bogursky et al. | 174/268 |
| 6,790,056 B2 * | 9/2004 | Buondelmonte et al. | 439/83 |
| 7,025,604 B2 | 4/2006 | Fronk | |
| 7,347,750 B2 * | 3/2008 | Cachina et al. | 439/876 |
| 2006/0279394 A1 | 12/2006 | Estrov | |

FOREIGN PATENT DOCUMENTS

WO    0137624 A1    5/2001

OTHER PUBLICATIONS

Written opinion for international application No. PCT/US2008/078959.

\* cited by examiner a)                                    b)

TERMINATION APPARATUS AND METHOD FOR PLANAR COMPONENTS ON PRINTED CIRCUIT BOARDS

CROSS-REFERENCE TO RELATED APPLICATIONS

This application claims the benefit of U.S. provisional application No. 60/997,633 filed Oct. 5, 2007, which is hereby incorporated herein by reference for all purposes.

BACKGROUND OF THE INVENTION

The preferred power-conversion method for modern electronic equipment is the Switching Mode Power Supply (SMPS). It is characterized by high efficiency and resulting low wasted heat dissipation.

In order to create the SMPS circuit, various inductive components are required. As modern electronic devices shrink in dimensions, correspondingly all inductive components must be reduced in size. One method for achieving this reduction in size is to use so-called planar inductive structures, where the magnetic-path components (core) are snapped around flat windings incorporated into the printed-circuit board (PCB). A PCB may actually be carrying all components of the device (main PCB). More commonly, however, a PCB carrying an inductive component may be a separate "winding" PCB attached to the main PCB, while utilizing the same or different number of copper layers as in the main PCB.

Effective mechanical attachment and low-resistance electrical termination (connections) of the windings to the main PCB is difficult, and consumes significant areas on both the main PCB and the winding PCB. In addition, typical termination strategies make use of soldered connections, leading to a fundamental problem when such strategies are applied to joining planar components. When two pieces of metal are joined by soldering, there could be two basic situations, as shown in FIG. 1: (a) Two metal pieces are butted together and affixed with a single-meniscus of solder at the joint; or (b) Two pieces of metal spaced apart, but joined by a double-meniscus of solder between the two pieces of metal. In both cases, there is at least one area where solder forms meniscus (due to surface tension when the solder is in liquid form). If solder does not form a concave meniscus—the solder joint is not going to be strong, and the integrity of the joint will not be reliable.

Ideally, the windings of a transformer occupy the whole available "window" of the magnetic core. It is necessary for two reasons: (1) To be able to fit as much copper as possible, so that the DC resistance (and thus the heat losses) is as low as possible, and (2) to prevent possible formation of plasma due to empty pockets of air.

The planar transformer is typically constructed with winding made with exactly the same technology as the ordinary PCBs—with copper conductors (formed by etching or electro deposition) on the top, bottom, and possibly several internal layers. More than a single PCB may form all the windings of a single transformer—thus there is a need to be able to electrically connect these windings between each other, and to the "main" PCB.

One proposed solution in the art (see PCT Publication WO 01/37624 A1) specifically require a certain distance "k" between the conductors on two PCBs to be joined—in order to allow sufficient space for the solder to penetrate and to form "double meniscus", as shown in FIG. 1. However, this proposed solution does not meet the need of having PCBs containing planar inductive components located effectively without any space between the PCBs.

Another proposed solution to terminating stacks of PCBs together in the construction for a "surface mountable" planar transformer is described in U.S. Pat. No. 6,073,339 ('339 patent). In the '339 patent, termination of the complete stack of PCBs that constitute the transformer's windings is achieved similarly to the well-known method of mounting SMT (Surface Mount Technology) components. The solder joint between the "windings" PCBs and the "main" PCB is similar to illustration of the "butted" joint described in FIG. 1. While the '339 patent does not specifically mention the fact that the "main" PCB also carries parts of the winding and is located inside of the magnetic path of the core, it suggests that the "main" PCB has a cut-out that matches the size of the magnetic core. A closer look at the solder termination used in the '339 patent reveals that this method cannot achieve zero space between PCBs. There would be significant space between the PCBs being joined, as shown in the depiction of the solder joint shown in FIG. 2, even if the metal traces touch directly (which is not the case during typical SMT assembly operations, as the top PCB "floats" on the molten solder). The area of the solder termination shown in FIG. 2 is located outside the thickness of the PCB, which necessarily causes an undesirable air space.

Another example of a proposed solution in the art (U.S. Patent Application Publication 2006/0279394 ('394 publication)) discloses a method for connecting several PCBs (that are utilized as windings in the planar transformer) to terminals that would in turn be connected to another "main" PCB or directly to wires. It can be clearly seen that the '394 publication does not provide a method that allows PCBs to be touching, as the solder meniscus has to be formed on both top and bottom of each PCB that is soldered to the common terminal. In the '394 publication, the interloper terminals are absolutely necessary, as they provide the electrical connection path from the "winding" PCBs to "main" PCB or to wires.

The above-mentioned examples of existing art leave a need to more-effectively make these PCB terminations to enable planar transformers.

BRIEF SUMMARY OF THE INVENTION

It is the objective of the current invention to be able to interconnect two or more PCBs that constitute the windings of the planar transformer, and to have these PCBs actually touching each other, without any "unused" air pockets between them, as discussed in the Background section.

The proposed invention allows the efficient termination of a winding PCB of the planar inductive component to the main PCB, using relatively little space and providing a low-resistance connection. The disclosed methods are especially suitable for planar structures where several winding PCBs, and/or winding PCBs and a main PCB, are all enclosed by the magnetic path components (core). These methods allow for a winding PCB to simply rest on the main PCB, or other winding PCBs, without any clearance.

The invention employs a mating set of conductive annular rings with an interlocking, but optional, terminal pin that allows two PCBs to be electrically connected and mechanically fixed together, while preserving a minimum distance between the solder-mask layers of the two PCBs in order to prevent the formation of unwanted connections or solder bridges between the two PCBs. Solder is used to ensure effective electrical coupling in each assembly of mating annular rings and interlocking terminal pin.

DETAILED DESCRIPTION

First Embodiment

Connecting a Winding PCB to a Main PCB

Figure 1:
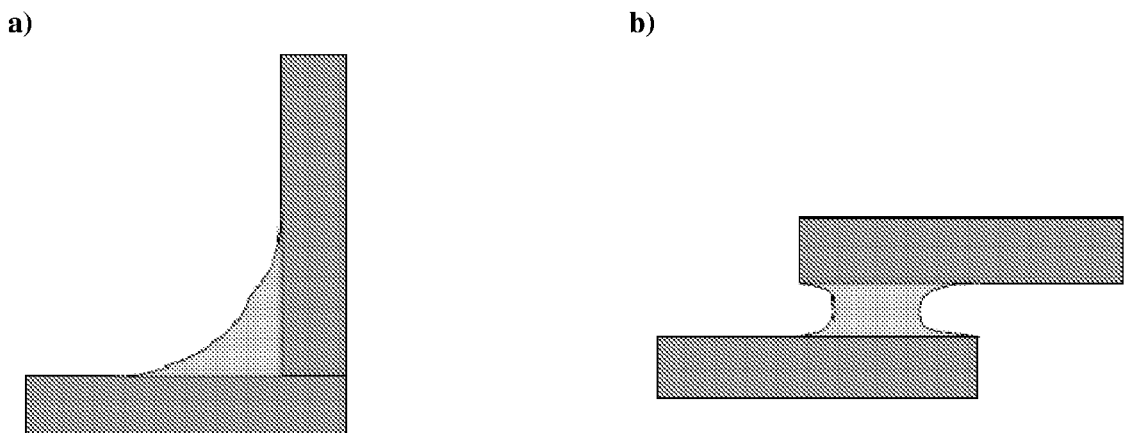
FIG. 1 depicts the two basic situations that arise when two pieces of metal are joined by soldering: (a) two metal pieces are butted together and affixed with a single-meniscus of solder at the joint; or (b) two pieces of metal spaced apart, but joined by a double-meniscus of solder between the two pieces of metal.
Figure 2:
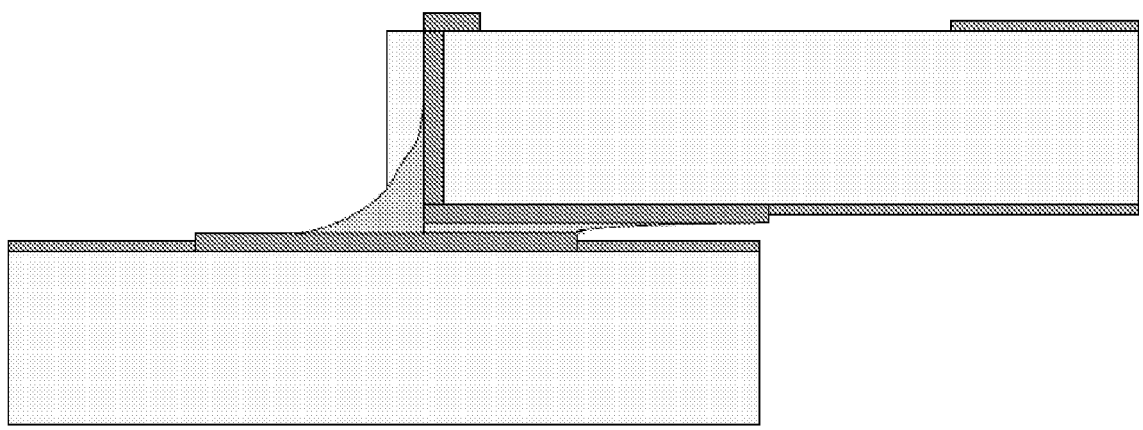
FIG. 2 depicts the solder joint from one proposed solution in the art (U.S. Pat. No. 6,073,339), which prescribes the area of the solder termination used to be located between the PCBs and on a side of one of the PCBs, thus maintaining unwanted air pockets that can affect planar transformers.
Figure 3:
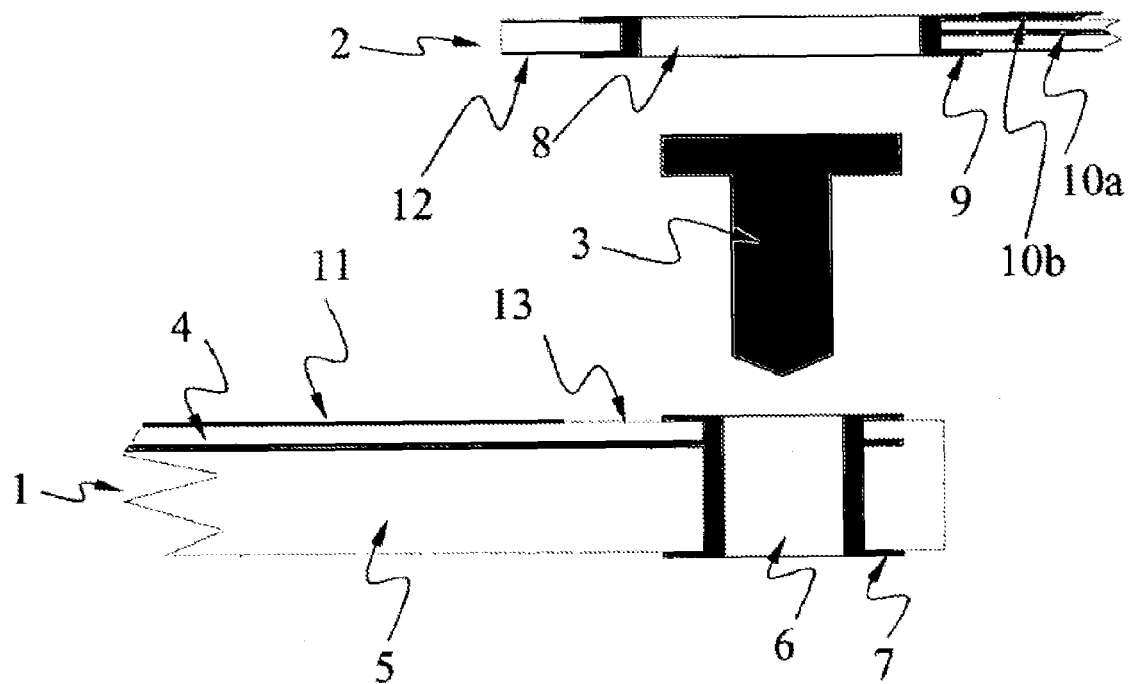
FIG. 3 depicts one embodiment of an unassembled cross-cut view of a termination between PCBs, as proposed by this specification.

Refer to FIG. 3, which shows a winding PCB (1) (possibly of a so-called multi-layer construction), a main PCB (2) (also possibly of a so-called multi-layer construction), and a terminal pin (3). The terminal pin (3) is shown as having a "mushroom" shape, but in practice is not required to have this shape to be effective. Additionally, the terminal pin (3) is made from a solderable material; for example, copper or copper alloy.

Both the winding PCB (1) and the main PCB (2) are manufactured using established methods well-known in the industry. Each of these PCBs consists of insulating material (5), with representative copper traces (4 and 10a) embedded inside the PCB or located on the surface of the PCB (10b).

Applied on both surfaces of each PCB are so-called solder-mask layers (11 and 12). However, the solder-mask material is notably absent from the area (13) surrounding the conductive annular male ring (7) on PCB (1) around the plated-through hole (6). The absence of the solder mask in area (13) allows for the conductive annular female ring (9) on PCB (2) to rest directly on the isolated area (13) of PCB (1), which in turn ensures the maintenance of a minimum distance between the solder-mask layers (11 and 12) of the two PCBs. This minimum distance needs to be maintained in order to protect against capillary action of molten solder, thus preventing the formation of unwanted connections or solder bridges between the two PCBs.

Figure 4:
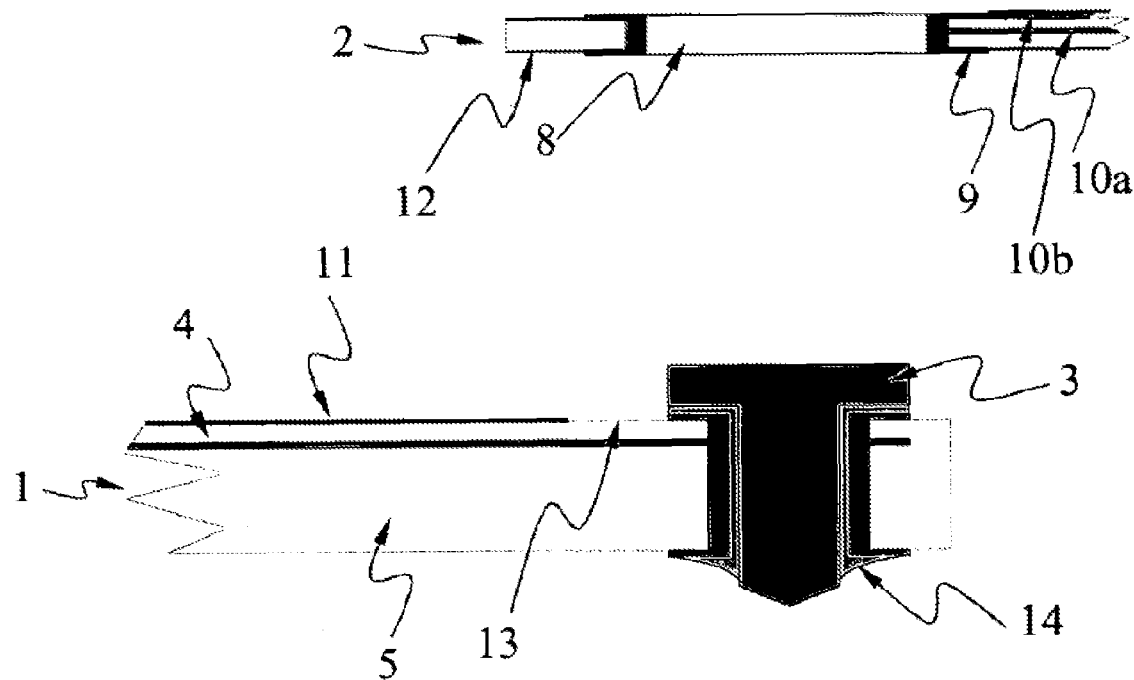
FIG. 4 depicts one embodiment of the attachment of a terminal pin in to a PCB containing an annular male ring.

Refer to FIG. 4, which shows the attachment of a terminal pin (3) in to the winding PCB (1) containing an annular male ring (7). This terminal-pin (3) attachment is replicated for each terminal connection between the winding PCB (1) and the main PCB (2). Terminal pin (3) is attached to the winding PCB (1) by inserting it into the plated-through hole (FIG. 3: 6) and soldering (14) the terminal pin (3) to the annular male ring (7).

One skilled in the art would find it immediately apparent that the proper selection of the dimensions for the terminal pin (3) may create a connection that does not protrude over the top or bottom surfaces of PCB (1) and PCB (2), respectively. It is also apparent that a simple thick wire, or a rectangular wire capable of self-clinching into the plated-through hole (FIG. 3: 6), is each suitable for use instead of a "mushroom" shaped terminal pin (3) shown in the figures.

Figure 5:
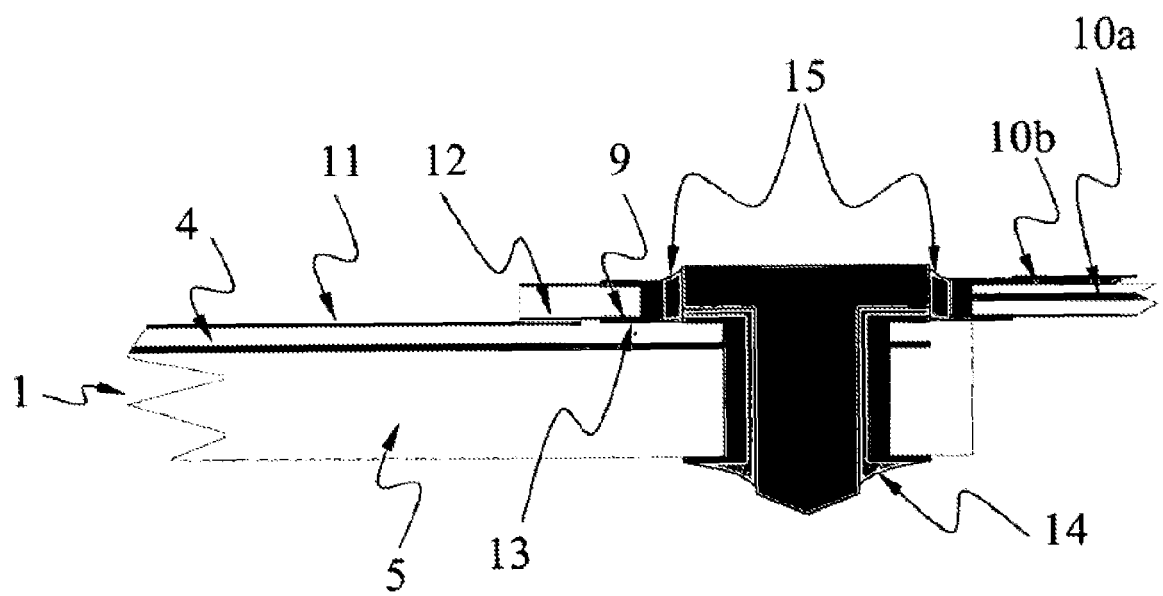
FIG. 5 depicts one embodiment of the fully assembled cross-cut view of a termination between PCBs, as proposed by this specification.

Refer to FIG. 5, which shows the fully assembled cross-cut view of a termination between the winding PCB (1) and the main PCB (FIG. 3: 2). The annular male ring (FIG. 3: 7) on the winding PCB (1), which now contains the soldered terminal pin (FIG. 3: 3) is inserted into the plated-through hole (FIG. 3: 8) in the annular female ring (9) on the main PCB (2). The terminal pin (FIG. 3: 3) is soldered (15) to the annular female ring (9) on the main PCB (FIG. 3: 2), which completes the termination at that point between the two PCBs.

This embodiment assumes the use of the terminal pin (FIG. 3: 3) in a PCB termination; however, it is important to note that terminal pins are merely used as a convenience and to limit the amount of solder applied. In practice, the termination prescribed in this embodiment could be accomplished with a substitute for the terminal pin, such as a wire, or even could be accomplished without a terminal pin (or terminal-pin substitute).

The shape of the plated-through holes (FIG. 3: 6 and 8) of the annular male ring (FIG. 3: 7) and annular female ring (FIG. 3: 9) need not be a specifically circular, but can be a more-complex oblong, or even other shapes, so long as the plated-through hole (FIG. 3: 8) for the annular female ring (FIG. 3: 9) is sized and shaped to completely encase the annular male ring (FIG. 3: 7) around the plated-through hole (FIG. 3: 6) and, once soldered, facilitate communicative coupling between the two PCBs.

In a typical embodiment, there would be at least two terminations providing galvanic connections according to this invention per set of PCBs, which would both improve mechanical strength and reduced electrical resistance between the connected PCBs. However, it can be anticipated that there may be applications where only one such termination between PCBs is made, with other electrical routes providing galvanic connections to complete a circuit.

The present invention can be applied to simple connections between PCBs, even if no inductive component is involved with either PCB.

Second Embodiment

An Interconnected Set of PCBs with Terminations that Employ Termination Pins

This embodiment employs an interconnected set of printed circuit boards (PCBs), having a first PCB and a second PCB, said first and second PCBs configured with components needing electrical or flux coupling with components on the other of said first and second PCBs, each said PCB being constructed from insulating and non-insulating materials with conducting traces embedded inside or located on the surface of each said PCB, said PCBs coupled by at least one termination point, each said termination point comprising: a male conductive annular ring seated in said first PCB, wherein said male conductive annular ring contains a plated-through hole, and wherein the termination mating area of said first PCB immediately surrounding said male conductive annular ring is not covered with solder-mask material; a female conductive annular ring seated in said second PCB, said female conductive annular ring containing a plated-through hole, wherein said plated-through hole of said female conductive annular ring is sized and shaped to fit around and be coupled with said male conductive annular ring seated in said first PCB, and wherein the outer circumference and axial mating surface of said female conductive annular ring is sized and shaped to make corresponding contact with said area around said male conductive annular ring that is not covered with solder-mask; wherein all aforementioned conductive annular rings are sized and shaped to allow fitting between said pair of male and female conductive annular rings; a terminal pin sized and shaped to fit into said plated-through hole of said male conductive annular ring; and a terminal coupling of said first PCB with said second PCB, wherein said terminal pin is disposed in said plated-through hole of said male conductive annular ring and fixed in place with solder, wherein said plated-through hole of said female conductive annular ring is mated with the outer surface of said male conductive annular ring, wherein the top of said terminal pin does not substantially protrude beyond the non-mated axial surface of said female conductive annular ring, wherein said terminal pin is fixed to said female conductive annular ring with solder, wherein no portion of solder for of any said solder joint is disposed between the planar surfaces of said first and second PCBs, thereby ensuring that no unused air space exists between said first and second PCBs, and wherein a minimum distance between the non-terminal interface areas of said first and second PCBs is maintained to prevent unwanted electrical connections between said first and second PCBs.

This embodiment can be further extended wherein: said terminal pin has a narrow portion designed to fit into a corresponding male conductive annular ring of said first PCB and has a wide portion that is too wide to fit in said corresponding male conducting annular ring of said first PCB and said wide portion is designed to fit into a corresponding female conductive annular ring of said second PCB, but said wide portion is wider than said plated-through hole of said male conductive annular ring; and solder is used to ensure coupling across any voids between each set of conductive annular rings and their corresponding terminal pin.

This embodiment can be further extended wherein: said terminal pin is a simple thick wire; and solder is used to ensure coupling across any voids between each conductive annular ring and its corresponding terminal pin.

This embodiment can be further extended wherein said first PCB or said second PCB contains at least one planar inductive component.

This embodiment can be further extended wherein said first PCB or said second PCB are communicatively coupled by way of electro-magnetic flux coupling.

This embodiment can be further extended wherein said conductive annular rings are circular in shape and each said pair of male and female conductive annular rings is sized to allow fitting between each said pair of male and female conductive annular rings.

This embodiment can be further extended wherein all aforementioned conductive annular rings are more-complex oblong in shape and each said pair of male and female conductive annular rings is sized to allow fitting between said pair of male and female conductive annular rings.

Third Embodiment

Method for Creating an Interconnected Set of PCBs with Terminations that Employ Termination Pins This embodiment discloses a method for interconnecting a set of printed circuit boards (PCBs), having a first PCB and a second PCB, said first and second PCBs configured with components needing electrical or flux coupling with components on the other of said first and second PCBs, each said PCB being constructed from insulating and non-insulating materials with conducting traces embedded inside or located on the surface of each said PCB, said PCBs coupled by at least one termination point, each said termination point being made by the method comprising the steps of: providing a male conductive annular ring seated in said first PCB, wherein said male conductive annular ring contains a plated-through hole, and wherein the termination mating area of said first PCB immediately surrounding said male conductive annular ring is not covered with solder-mask material; providing a female conductive annular ring seated in said second PCB, said female conductive annular ring containing a plated-through hole, wherein said plated-through hole of said female conductive annular ring is sized and shaped to fit around and be coupled with said male conductive annular ring seated in said first PCB, and wherein the outer circumference and axial mating surface of said female conductive annular ring is sized and shaped to make corresponding contact with said area around said male conductive annular ring that is not covered with solder-mask; wherein all aforementioned conductive annular rings are sized and shaped to allow fitting between said pair of male and female conductive annular rings; providing a terminal pin sized and shaped to fit into said plated-through hole of said male conductive annular ring; and providing a terminal coupling of said first PCB with said second PCB, wherein said terminal pin is inserted into said plated-through hole of said male conductive annular ring, then soldered in place, wherein said plated-through hole of said female conductive annular ring is mated with the outer surface of said male conductive annular ring, wherein the top of said terminal pin does not substantially protrude beyond the non-mated axial surface of said female conductive annular ring, wherein said terminal pin is soldered to said female conductive annular ring, wherein no portion of solder for of any said solder joint is disposed between the planar surfaces of said first and second PCBs, thereby ensuring that no unused air space exists between said first and second PCBs, and wherein a minimum distance between the non-terminal interface areas of said first and second PCBs is maintained to prevent unwanted electrical connections between said first and second PCBs.

This embodiment can be further extended wherein: said terminal pin has a narrow portion designed to fit into a corresponding male conductive annular ring of said first PCB and has a wide portion that is too wide to fit in said corresponding male conducting annular ring of said first PCB and said wide portion is designed to fit into a corresponding female conductive annular ring of said second PCB, but said wide portion is wider than said plated-through hole of said male conductive annular ring; and solder is used to ensure coupling across any voids between each set of conductive annular rings and their corresponding terminal pin.

This embodiment can be further extended wherein: said terminal pin is a simple thick wire; and solder is used to ensure coupling across any voids between each conductive annular ring and its corresponding terminal pin.

This embodiment can be further extended wherein said first PCB or said second PCB contains at least one planar inductive component.

This embodiment can be further extended wherein said first PCB or said second PCB are communicatively coupled by way of electro-magnetic flux coupling.

This embodiment can be further extended wherein said conductive annular rings are circular in shape and each said pair of male and female conductive annular rings is sized to allow fitting between each said pair of male and female conductive annular rings.

This embodiment can be further extended wherein all aforementioned conductive annular rings are more-complex oblong in shape and each said pair of male and female conductive annular rings is sized to allow fitting between said pair of male and female conductive annular rings.

Fourth Embodiment

An Interconnected Set of PCBs with Terminations that do not Employ Termination Pins This embodiment discloses an interconnected set of printed circuit boards (PCBs), having a first PCB and a second PCB, said first and second PCBs configured with components needing electrical or flux coupling with components on the other of said first and second PCBs, each said PCB being constructed from insulating and non-insulating materials with conducting traces embedded inside or located on the surface of each said PCB, said PCBs coupled by at least one termination point, each said termination point comprising: a male conductive annular ring seated in said first PCB, wherein said male conductive annular ring contains a plated-through hole, and wherein the termination mating area of said first PCB immediately surrounding said male conductive annular ring is not covered with solder-mask material; a female conductive annular ring seated in said second PCB, said female conductive annular ring containing a plated-through hole, wherein said plated-through hole of said female conductive annular ring is sized and shaped to fit around and be coupled with said male conductive annular ring seated in said first PCB, and wherein the outer circumference and axial mating surface of said female conductive annular ring is sized and shaped to make corresponding contact with said area around said male conductive annular ring that is not covered with solder-mask; wherein all aforementioned conductive annular rings are sized and shaped to allow fitting between said pair of male and female conductive annular rings; and a terminal coupling of said first PCB with said second PCB, wherein said plated-through hole of said female conductive annular ring is mated with the outer surface of said male conductive annular ring, wherein the internal void contained within said mated female and male conductive annular rings is substantially filled with solder, thereby fixedly coupling said female and male conductive annular rings, wherein no portion of solder for of any said solder joint is disposed between the planar surfaces of said first and second PCBs, thereby ensuring that no unused air space exists between said first and second PCBs, and wherein a minimum distance between the non-terminal interface areas of said first and second PCBs is maintained to prevent unwanted electrical connections between said first and second PCBs.

This embodiment can be further extended wherein said first PCB or said second PCB contains at least one planar inductive component.

This embodiment can be further extended wherein said first PCB or said second PCB are communicatively coupled by way of electro-magnetic flux coupling.

This embodiment can be further extended wherein said conductive annular rings are circular in shape and each said pair of male and female conductive annular rings is sized to allow fitting between each said pair of male and female conductive annular rings.

This embodiment can be further extended wherein all aforementioned conductive annular rings are more-complex oblong in shape and each said pair of male and female conductive annular rings is sized to allow fitting between said pair of male and female conductive annular rings.

Fifth Embodiment

Method for Creating an Interconnected Set of PCBs with Terminations that do not Employ Terminations Pins This embodiment discloses a method for interconnecting a set of printed circuit boards (PCBs), having a first PCB and a second PCB, said first and second PCBs configured with components needing electrical or flux coupling with components on the other of said first and second PCBs, each said PCB being constructed from insulating and non-insulating materials with conducting traces embedded inside or located on the surface of each said PCB, said PCBs coupled by at least one termination point, each said termination point being made by the method comprising the steps of: providing a male conductive annular ring seated in said first PCB, wherein said male conductive annular ring contains a plated-through hole, and wherein the termination mating area of said first PCB immediately surrounding said male conductive annular ring is not covered with solder-mask material; providing a female conductive annular ring seated in said second PCB, said female conductive annular ring containing a plated-through hole, wherein said plated-through hole of said female conductive annular ring is sized and shaped to fit around and be coupled with said male conductive annular ring seated in said first PCB, and wherein the outer circumference and axial mating surface of said female conductive annular ring is sized and shaped to make corresponding contact with said area around said male conductive annular ring that is not covered with solder-mask; wherein all aforementioned conductive annular rings are sized and shaped to allow fitting between said pair of male and female conductive annular rings; and providing a terminal coupling of said first PCB with said second PCB, wherein said plated-through hole of said female conductive annular ring is mated with the outer surface of said male conductive annular ring, wherein the internal void contained within said mated female and male conductive annular rings is substantially filled with solder, thereby fixedly coupling said female and male conductive annular rings, wherein no portion of solder for of any said solder joint is disposed between the planar surfaces of said first and second PCBs, thereby ensuring that no unused air space exists between said first and second PCBs, and wherein a minimum distance between the non-terminal interface areas of said first and second PCBs is maintained to prevent unwanted electrical connections between said first and second PCBs.

This embodiment can be further extended wherein said first PCB or said second PCB contains at least one planar inductive component.

This embodiment can be further extended wherein said first PCB or said second PCB are communicatively coupled by way of electro-magnetic flux coupling.

This embodiment can be further extended wherein said conductive annular rings are circular in shape and each said pair of male and female conductive annular rings is sized to allow fitting between each said pair of male and female conductive annular rings.

This embodiment can be further extended wherein all aforementioned conductive annular rings are more-complex oblong in shape and each said pair of male and female conductive annular rings is sized to allow fitting between said pair of male and female conductive annular rings.

Potential Obvious Variations and Improvements

Those skilled in the art will have no difficultly devising myriad obvious variations and improvements to the invention, all of which are intended to be encompassed within the scope of the claims which follow. For example, the invention can also be employed as an efficient and compact way of connecting together PCBs that do not contain planar inductive components.

What is claimed is:

1. An interconnected set of printed circuit boards (PCBs), having a first PCB and a second PCB, said first and second PCBs configured with components needing electrical or flux coupling with components on the other of said first and second PCBs, each said PCB being constructed from insulating and non-insulating materials with conducting traces embedded inside or located on the surface of each said PCB, said PCBs coupled by at least one termination point, each said termination point comprising:
   a male conductive annular ring seated in said first PCB,
      wherein said male conductive annular ring contains a plated-through hole, and
      wherein the termination mating area of said first PCB immediately surrounding said male conductive annular ring is not covered with solder-mask material;
   a female conductive annular ring seated in said second PCB, said female conductive annular ring containing a plated-through hole,
      wherein said plated-through hole of said female conductive annular ring is sized and shaped to fit around and be coupled with said male conductive annular ring seated in said first PCB, and
      wherein the outer circumference and axial mating surface of said female conductive annular ring is sized and shaped to make corresponding contact with said area around said male conductive annular ring that is not covered with solder-mask;
   wherein all aforementioned conductive annular rings are sized and shaped to allow fitting between said pair of male and female conductive annular rings;
   a terminal pin sized and shaped to fit into said plated-through hole of said male conductive annular ring; and
   a terminal coupling of said first PCB with said second PCB,
      wherein said terminal pin is disposed in said plated-through hole of said male conductive annular ring and fixed in place with solder,
      wherein said plated-through hole of said female conductive annular ring is mated with the outer surface of said male conductive annular ring,
      wherein the top of said terminal pin does not substantially protrude beyond the non-mated axial surface of said female conductive annular ring,
      wherein said terminal pin is fixed to said female conductive annular ring with solder,
      wherein no portion of solder for of any said solder joint is disposed between the planar surfaces of said first and second PCBs, thereby ensuring that no unused air space exists between said first and second PCBs, and
      wherein a minimum distance between the non-terminal interface areas of said first and second PCBs is maintained to prevent unwanted electrical connections between said first and second PCBs.

2. The interconnected set of PCBs of claim 1, wherein:
   said terminal pin has a narrow portion designed to fit into a corresponding male conductive annular ring of said first PCB and has a wide portion that is too wide to fit in said corresponding male conducting annular ring of said first PCB and said wide portion is designed to fit into a corresponding female conductive annular ring of said second PCB, but said wide portion is wider than said plated-through hole of said male conductive annular ring; and
   solder is used to ensure coupling across any voids between each set of conductive annular rings and their corresponding terminal pin.

3. The interconnected set of PCBs of claim 1, wherein:
   said terminal pin is a simple thick wire; and
   solder is used to ensure coupling across any voids between each conductive annular ring and its corresponding terminal pin.

4. The interconnected set of PCBs of claim 1, wherein said first PCB or said second PCB contains at least one planar inductive component.

5. The interconnected set of PCBs of claim 4, wherein said first PCB or said second PCB are communicatively coupled by way of electro-magnetic flux coupling.

6. The interconnected set of PCBs of claim 1, wherein said conductive annular rings are circular in shape and each said pair of male and female conductive annular rings is sized to allow fitting between each said pair of male and female conductive annular rings.

7. The interconnected set of PCBs of claim 1, wherein all aforementioned conductive annular rings are more-complex oblong in shape and each said pair of male and female conductive annular rings is sized to allow fitting between said pair of male and female conductive annular rings.

8. A method for interconnecting a set of printed circuit boards (PCBs), having a first PCB and a second PCB, said first and second PCBs configured with components needing electrical or flux coupling with components on the other of said first and second PCBs, each said PCB being constructed from insulating and non-insulating materials with conducting traces embedded inside or located on the surface of each said PCB, said PCBs coupled by at least one termination point, each said termination point being made by the method comprising the steps of:
   providing a male conductive annular ring seated in said first PCB,
      wherein said male conductive annular ring contains a plated-through hole, and
      wherein the termination mating area of said first PCB immediately surrounding said male conductive annular ring is not covered with solder-mask material;
   providing a female conductive annular ring seated in said second PCB, said female conductive annular ring containing a plated-through hole,
      wherein said plated-through hole of said female conductive annular ring is sized and shaped to fit around and be coupled with said male conductive annular ring seated in said first PCB, and
      wherein the outer circumference and axial mating surface of said female conductive annular ring is sized and shaped to make corresponding contact with said area around said male conductive annular ring that is not covered with solder-mask;
   wherein all aforementioned conductive annular rings are sized and shaped to allow fitting between said pair of male and female conductive annular rings;
   providing a terminal pin sized and shaped to fit into said plated-through hole of said male conductive annular ring; and
   providing a terminal coupling of said first PCB with said second PCB,
      wherein said terminal pin is inserted into said plated-through hole of said male conductive annular ring, then soldered in place, wherein said plated-through hole of said female conductive annular ring is mated with the outer surface of said male conductive annular ring, wherein the top of said terminal pin does not substantially protrude beyond the non-mated axial surface of said female conductive annular ring, wherein said terminal pin is soldered to said female conductive annular ring, wherein no portion of solder for of any said solder joint is disposed between the planar surfaces of said first and second PCBs, thereby ensuring that no unused air space exists between said first and second PCBs, and wherein a minimum distance between the non-terminal interface areas of said first and second PCBs is maintained to prevent unwanted electrical connections between said first and second PCBs.

9. The method of claim 8, wherein:

said terminal pin has a narrow portion designed to fit into a corresponding male conductive annular ring of said first PCB and has a wide portion that is too wide to fit in said corresponding male conducting annular ring of said first PCB and said wide portion is designed to fit into a corresponding female conductive annular ring of said second PCB, but said wide portion is wider than said plated-through hole of said male conductive annular ring; and solder is used to ensure coupling across any voids between each set of conductive annular rings and their corresponding terminal pin.

10. The method of claim 8, wherein:

said terminal pin is a simple thick wire; and solder is used to ensure coupling across any voids between each conductive annular ring and its corresponding terminal pin.

11. The method of claim 8, wherein said first PCB or said second PCB contains at least one planar inductive component.

12. The method of claim 11, wherein said first PCB or said second PCB are communicatively coupled by way of electro-magnetic flux coupling.

13. The method of claim 8, wherein said conductive annular rings are circular in shape and each said pair of male and female conductive annular rings is sized to allow fitting between each said pair of male and female conductive annular rings.

14. The method of claim 8, wherein all aforementioned conductive annular rings are more-complex oblong in shape and each said pair of male and female conductive annular rings is sized to allow fitting between said pair of male and female conductive annular rings.

15. An interconnected set of printed circuit boards (PCBs), having a first PCB and a second PCB, said first and second PCBs configured with components needing electrical or flux coupling with components on the other of said first and second PCBs, each said PCB being constructed from insulating and non-insulating materials with conducting traces embedded inside or located on the surface of each said PCB, said PCBs coupled by at least one termination point, each said termination point comprising:

a male conductive annular ring seated in said first PCB, wherein said male conductive annular ring contains a plated-through hole, and wherein the termination mating area of said first PCB immediately surrounding said male conductive annular ring is not covered with solder-mask material;

a female conductive annular ring seated in said second PCB, said female conductive annular ring containing a plated-through hole, wherein said plated-through hole of said female conductive annular ring is sized and shaped to fit around and be coupled with said male conductive annular ring seated in said first PCB, and wherein the outer circumference and axial mating surface of said female conductive annular ring is sized and shaped to make corresponding contact with said area around said male conductive annular ring that is not covered with solder-mask;

wherein all aforementioned conductive annular rings are sized and shaped to allow fitting between said pair of male and female conductive annular rings; and a terminal coupling of said first PCB with said second PCB, wherein said plated-through hole of said female conductive annular ring is mated with the outer surface of said male conductive annular ring, wherein the internal void contained within said mated female and male conductive annular rings is substantially filled with solder, thereby fixedly coupling said female and male conductive annular rings, wherein no portion of solder for of any said solder joint is disposed between the planar surfaces of said first and second PCBs, thereby ensuring that no unused air space exists between said first and second PCBs, and wherein a minimum distance between the non-terminal interface areas of said first and second PCBs is maintained to prevent unwanted electrical connections between said first and second PCBs.

16. The interconnected set of PCBs of claim 15, wherein said first PCB or said second PCB contains at least one planar inductive component.

17. The interconnected set of PCBs of claim 16, wherein said first PCB or said second PCB are communicatively coupled by way of electro-magnetic flux coupling.

18. The interconnected set of PCBs of claim 15, wherein said conductive annular rings are circular in shape and each said pair of male and female conductive annular rings are sized to allow fitting between each said pair of male and female conductive annular rings.

19. The interconnected set of PCBs of claim 15, wherein all aforementioned conductive annular rings are more-complex oblong in shape and each said pair of male and female conductive annular rings is sized to allow fitting between said pair of male and female conductive annular rings.

20. A method for interconnecting a set of printed circuit boards (PCBs), having a first PCB and a second PCB, said first and second PCBs configured with components needing electrical or flux coupling with components on the other of said first and second PCBs, each said PCB being constructed from insulating and non-insulating materials with conducting traces embedded inside or located on the surface of each said PCB, said PCBs coupled by at least one termination point, each said termination point being made by the method comprising the steps of:

providing a male conductive annular ring seated in said first PCB, wherein said male conductive annular ring contains a plated-through hole, and wherein the termination mating area of said first PCB immediately surrounding said male conductive annular ring is not covered with solder-mask material;

providing a female conductive annular ring seated in said second PCB, said female conductive annular ring containing a plated-through hole, wherein said plated-through hole of said female conductive annular ring is sized and shaped to fit around and be coupled with said male conductive annular ring seated in said first PCB, and wherein the outer circumference and axial mating surface of said female conductive annular ring is sized and shaped to make corresponding contact with said area around said male conductive annular ring that is not covered with solder-mask;

wherein all aforementioned conductive annular rings are sized and shaped to allow fitting between said pair of male and female conductive annular rings; and providing a terminal coupling of said first PCB with said second PCB, wherein said plated-through hole of said female conductive annular ring is mated with the outer surface of said male conductive annular ring, wherein the internal void contained within said mated female and male conductive annular rings is substantially filled with solder, thereby fixedly coupling said female and male conductive annular rings, wherein no portion of solder for of any said solder joint is disposed between the planar surfaces of said first and second PCBs, thereby ensuring that no unused air space exists between said first and second PCBs, and wherein a minimum distance between the non-terminal interface areas of said first and second PCBs is maintained to prevent unwanted electrical connections between said first and second PCBs.

21. The method of claim 20, wherein said first PCB or said second PCB contains at least one planar inductive component.

22. The method of claim 21, wherein said first PCB or said second PCB are communicatively coupled by way of electromagnetic flux coupling.

23. The method of claim 20, wherein said conductive annular rings are circular in shape and each said pair of male and female conductive annular rings is sized to allow fitting between each said pair of male and female conductive annular rings.

24. The method of claim 20, wherein all aforementioned conductive annular rings are more-complex oblong in shape and each said pair of male and female conductive annular rings is sized to allow fitting between said pair of male and female conductive annular rings.

* * * * *